(12) United States Patent
Glass et al.

(10) Patent No.: US 11,588,017 B2
(45) Date of Patent: Feb. 21, 2023

(54) NANOWIRE FOR TRANSISTOR INTEGRATION

(71) Applicant: Intel Corporation, Santa Clara, CA (US)

(72) Inventors: Glenn A. Glass, Portland, OR (US); Chandra S. Mohapatra, Hillsboro, OR (US); Anand S. Murthy, Portland, OR (US); Karthik Jambunathan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 487 days.

(21) Appl. No.: 16/085,237

(22) PCT Filed: Mar. 30, 2016

(86) PCT No.: PCT/US2016/024810
§ 371 (c)(1),
(2) Date: Sep. 14, 2018

(87) PCT Pub. No.: WO2017/171736
PCT Pub. Date: Oct. 5, 2017

(65) Prior Publication Data
US 2020/0303499 A1      Sep. 24, 2020

(51) Int. Cl.
*H01L 29/06* (2006.01)
*H01L 29/423* (2006.01)
*H01L 29/66* (2006.01)

(52) U.S. Cl.
CPC .... *H01L 29/0669* (2013.01); *H01L 29/42392* (2013.01); *H01L 29/66545* (2013.01)

(58) Field of Classification Search
CPC ......... H01L 29/42392; H01L 29/66545; H01L 29/78684; H01L 29/78687;
(Continued)

(56) References Cited

U.S. PATENT DOCUMENTS 6,413,880 B1 * 7/2002 Baski .................... C30B 29/602
438/759
8,847,281 B2 9/2014 Cea et al.
(Continued)

FOREIGN PATENT DOCUMENTS

JP      2000021790 A    1/2000
TW      201332110 A     8/2013
(Continued)

OTHER PUBLICATIONS

PCT Dec. 28, 2016 International Search Report and Written Opinion issued in PCT Application No. PCT/US2016/024810 dated Dec. 28, 2016; 8 pages.
(Continued)

*Primary Examiner* — Mohammad M Hoque
(74) *Attorney, Agent, or Firm* — Akona IP PC

(57) ABSTRACT

Particular embodiments described herein provide for an electronic device that can include a nanowire channel. The nanowire channel can include nanowires and the nanowires can be about fifteen (15) or less angstroms apart. The nanowire channel can include more than ten (10) nanowires and can be created from a MXene material.

23 Claims, 18 Drawing Sheets

(58) Field of Classification Search
CPC ............. H01L 29/78696; H01L 29/808; H01L 29/66439; H01L 29/775; H01L 29/0673; H01L 29/66969; H01L 29/78; H01L 29/0669–068; H01L 29/0665; H01L 2924/13061; H01L 29/66469; H01L 29/7853–2029/7858; B82Y 10/00; Y10S 977/938
USPC ........................................................ 257/288
See application file for complete search history.

(56) References Cited

U.S. PATENT DOCUMENTS

| | | | |
|---|---|---|---|
| 9,299,939 B1* | 3/2016 | Cao | H01L 51/105 |
| 2003/0013280 A1* | 1/2003 | Yamanaka | H01L 21/02535 438/487 |
| 2003/0189235 A1* | 10/2003 | Watanabe | H01L 51/0048 257/432 |
| 2004/0119127 A1* | 6/2004 | Anazawa | H01L 51/0508 257/428 |
| 2005/0089467 A1* | 4/2005 | Grill | B82Y 40/00 423/447.3 |
| 2006/0118777 A1* | 6/2006 | Hirakata | B82Y 40/00 257/39 |
| 2006/0151844 A1* | 7/2006 | Avouris | B82Y 10/00 257/411 |
| 2006/0265789 A1* | 11/2006 | Kawai | B82Y 10/00 257/213 |
| 2008/0221806 A1* | 9/2008 | Bryant | G01N 33/497 702/22 |
| 2009/0014757 A1* | 1/2009 | Takulapalli | G01N 27/4145 257/253 |
| 2009/0253590 A1* | 10/2009 | Murakoshi | B82Y 30/00 506/22 |
| 2009/0294757 A1* | 12/2009 | Wernersson | H01L 29/0665 257/14 |
| 2009/0321716 A1* | 12/2009 | Wernersson | H01L 29/0665 257/24 |
| 2010/0012180 A1* | 1/2010 | Day | H01L 21/02532 136/256 |
| 2010/0224862 A1* | 9/2010 | Endoh | B82Y 10/00 257/24 |
| 2010/0261338 A1* | 10/2010 | Tsakalakos | H01L 29/66757 438/478 |
| 2013/0105897 A1* | 5/2013 | Bangsaruntip | H01L 29/78696 257/E21.632 |
| 2013/0313524 A1* | 11/2013 | De Micheli | H01L 29/66439 257/29 |
| 2014/0001520 A1 | 1/2014 | Glass et al. | |
| 2014/0035041 A1 | 2/2014 | Pillarisetty et al. | |
| 2014/0048773 A1 | 2/2014 | Chang et al. | |
| 2014/0166981 A1* | 6/2014 | Doyle | H01L 29/7827 257/24 |
| 2014/0353574 A1 | 12/2014 | Li et al. | |
| 2015/0069328 A1* | 3/2015 | Leobandung | H01L 29/42392 257/24 |
| 2015/0069330 A1 | 3/2015 | Baek et al. | |
| 2015/0236120 A1 | 8/2015 | Hashemi et al. | |
| 2016/0087212 A1* | 3/2016 | Klein | C07C 2/76 257/29 |
| 2017/0102358 A1* | 4/2017 | Hoffman | H01L 21/76879 |
| 2018/0372678 A1* | 12/2018 | Patolsky | G01N 27/4145 |
| 2019/0319188 A1* | 10/2019 | Tolle | B82Y 10/00 |
| 2020/0119203 A1* | 4/2020 | Teo | H01L 29/4908 |

FOREIGN PATENT DOCUMENTS

| | | |
|---|---|---|
| WO | 2013052541 A2 | 4/2013 |
| WO | 2013095646 A1 | 6/2013 |

OTHER PUBLICATIONS

TW Jul. 6, 2020 Office Action with Search Report from Taiwan Application No. 106105617; 10 pages [with English translation].
Naguib, Michael, et al., "Two-Dimensional Transition Metal Carbides," ACSNANO vol. 6, No. 2, pp. 1322-1331; Jan. 26, 2012.
Bhimanapati, Ganesh R., et al., "Recent Advances in Two-Dimensional Materials beyond Graphene," ACSNano, vol. 9, No. 12, 11509-11539, ACS Publications; Dec. 22, 2015.
EPO Oct. 23, 2019—Extended European Search Report and Search Opinion from European Application No. 1689793.3.
Xu, Bingzhe, et al., "Ultrathin MXene-Micropattern-Based Field-Effect Transistor for Probing Neural Activity," Advanced Materials, vol. 28, Issue 17, Feb. 29, 2019.
Zhang, Enze, et al., ReS2-Based Field-Effect Transistors and Photodetectors, Advanced Functional Materials Journal 25,4076-4082, May 22, 2015. 25, 4076-4082.

* cited by examiner

NANOWIRE FOR TRANSISTOR INTEGRATION

CROSS-REFERENCE TO RELATED APPLICATIONS

This Application is a national stage application under 35 U.S.C. § 371 of PCT Application PCT/US2016/024810, filed Mar. 30, 2016, and entitled "NANOWIRE FOR TRANSISTOR INTEGRATION," which is hereby incorporated by reference in its entirety.

TECHNICAL FIELD

The present disclosure relates generally to the field of integrated circuits, and more particularly, to substrates, assemblies, and techniques to enable a nanowire for transistor integration.

BACKGROUND

To increase the density of dies in an integrated circuit (IC) package of a particular footprint, one approach is based on thin film designs. These designs include a thin film or layer of material ranging from fractions of a nanometer (monolayer) to several micrometers in thickness. What is needed is a thin film design that can help to increase the number of logic elements per unit area.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

To provide a more complete understanding of the present disclosure and features and advantages thereof, reference is made to the following description, taken in conjunction with the accompanying figures, wherein like reference numerals represent like parts, in which.

Figure 1:
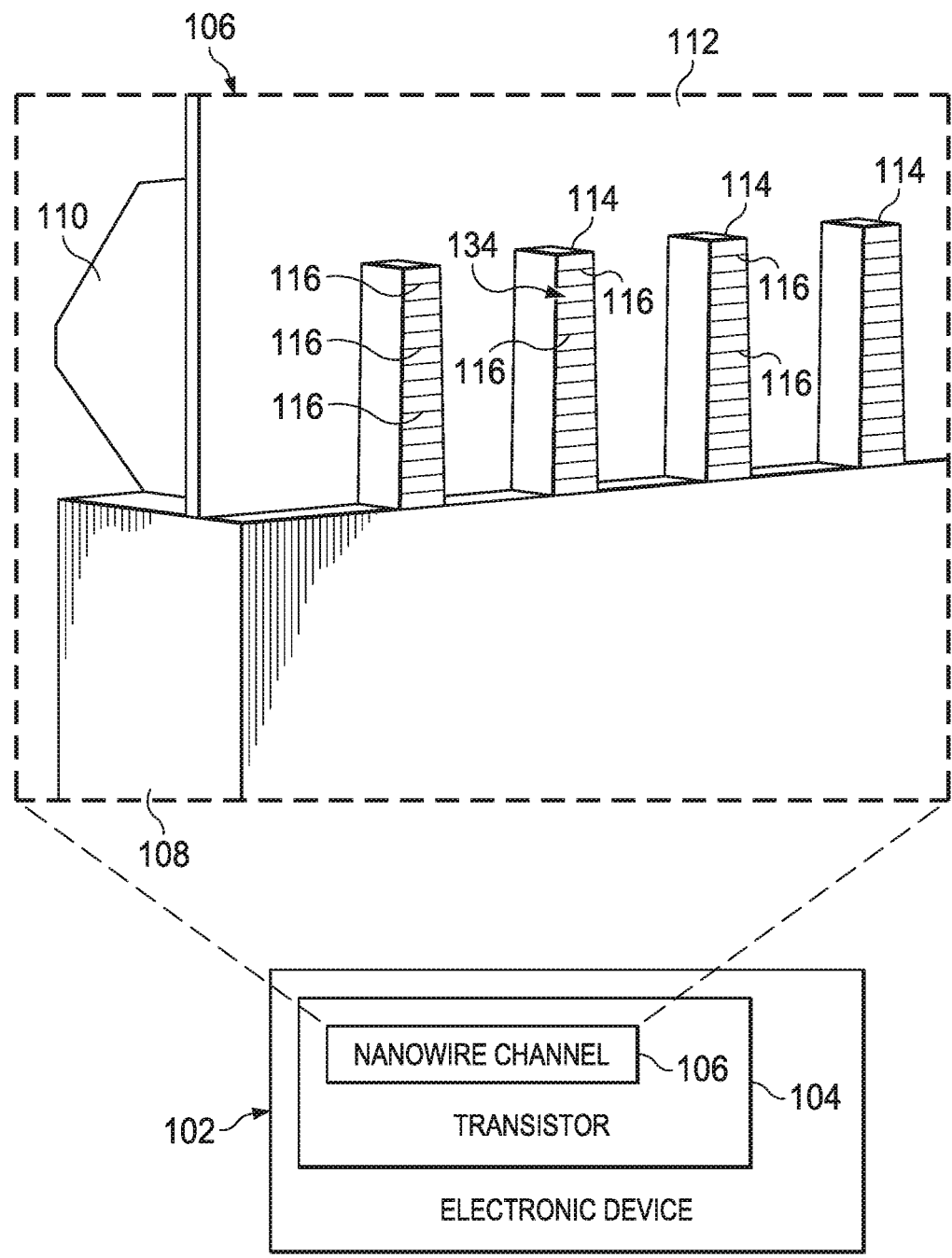
FIG. 1 is a simplified block diagram illustrating an embodiment of a portion of an electronic device, in accordance with an embodiment of the present disclosure.

The FIGURES of the drawings are not necessarily drawn to scale, as their dimensions can be varied considerably without departing from the scope of the present disclosure.

DETAILED DESCRIPTION OF EXAMPLE EMBODIMENTS

Example Embodiments

Described herein are systems and methods that include a nanowire channel, wherein the nanowire channel includes nanowires and the nanowires are about fifteen (15) or less angstroms apart. In an example, the nanowire channel includes about thirty (30) to about sixty (60) nanowires. In one instance, the nanowires are created from a MXene material.

In some examples, the nanowires are semiconducting with bandgaps in the range 0.5 eV to 4 eV. Further, the nanowire channel can be on a substrate and the substrate can have an amorphous surface structure. Also, the substrate can have a melting point in excess of 1000° C. In some instances, the apparatus is a transistor. More specifically, the transistor can be a MOS transistor.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, the terms "chip" and "die" may be used interchangeably.

As electronic technology is scaled down, electronic devices must include smaller and smaller components. To increase the density of dies in an integrated circuit (IC) package of a particular footprint, components may be stacked on top of each other. One approach is based on thin film designs. These designs include a thin film or layer of material ranging from fractions of a nanometer (monolayer) to several micrometers in thickness. In addition, it is often helpful to increase the number of logic elements per unit area.

A possible solution to increase the number of logic elements per unit area is to include layers of metal carbide or metal nitride or a hybrid of the two, that can be formed into massively parallel arrays of nanowires or nanoribbons to provide channels for logic and power switching microelectronic devices. Using this approach, the number of nanoribbons that can be packed in to a given gate height is roughly 32 times higher than current silicon nanowire devices. In an example, a MXene (so-called due to 2-D morphology that it shares with more commonly known graphene) type material may be used to create thin, (e.g., less than fifteen (15) angstroms thick or in one example, less than five (5) angstroms thick) semiconducting layers for microelectronic device applications. By using a MXene type material, one technical problem associated with creating thin semiconducting layers, namely the issue of internal spacer to prevent contact to gate shorts, becomes trivial because the removed layer between active semiconductor channel nanoribbons is so thin that it is blocked simply by deposition of a gate insulator.

MXenes are a class of two-dimensional inorganic compounds. These materials consist of a few atoms thick layers of transition metal carbide or carbonitrides. Over sixty (60) compounds of the precursor to MXenes, called MAX compounds have the property of forming self-assembled layers upon thermal treatment. MAX materials can include a soft portion containing aluminum or other soft metals can be dissolved away in acid or basic chemistry to release individual 2-D layers of MXenes. Many of these are insulating or metallic but some are semiconducting with bandgaps in the range of about 0.5 electron volts (eV) to about four (4) eV and these can be used for logic and power devices.

MXenes have a host of different requirements vs traditional silicon based devices and is also exempt from some requirements typical in silicon based logic technology. One requirement when using MXenes is a high temperature process compatibility. To fabricate the initial blanks of highly ordered MAX phase material, a substrate that can withstand extended high temperature soaks in excess of 1000° C. in corrosive environments must be used. Conveniently however, the substrate need not be a single crystal and can have an amorphous surface structure rather than the very ordered crystalline structure typical on conventional silicon substrates.

Turning to FIG. 1, FIG. 1 illustrate one embodiment of an electronic device 102. Electronic device 102 can include a transistor 104 and other electronic components. Transistor 104 can include a nanowire channel 106. Nanowire channel 106, illustrated in a cut-away diagram (cut through the center of the MOS transistor channel), can include a substrate 108, a source/drain 110, an insulator 112, and one or more channels 114. Each channel 114 can include nanowires 116. Nanowires 116 may be nanowires or nanoribbons that are about 15 or less angstroms in thickness and have a distance 134 that is about 15 or less angstroms between each nanowire 116. In an example, nanowires 116 may be nanowires or nanoribbons that are about 5 angstroms in thickness and have a gap that is about 5 angstroms between each nanowire 116. In an example, nanowire channel 106 can include more than ten (10) nanowires 116. In another example, nanowire channel 106 can include more than one hundred (100) nanowires 116.

Electronic device 102 can include a processor, memory software, hardware, firmware, or in any other suitable component, device, element, or object where appropriate and based on particular needs. Memory may keep information in any suitable memory element (e.g., random access memory (RAM), read-only memory (ROM), erasable programmable ROM (EPROM), electrically erasable programmable ROM (EEPROM), application specific integrated circuit (ASIC), etc.). The processor can be configured to execute software, an algorithm or any type of instructions. Electronic devices 102 can be a standalone device or a network element and includes, for example, desktop computers, laptop computers, mobile devices, personal digital assistants, smartphones, tablets, controllers, routers, wearable computers, or other electronic devices that include a transistor.

Transistor 104 can be a field effect transistor. In an example, transistor 104 can be a metal-oxide-semiconductor field-effect transistor (MOSFET), junction gate field-effect transistor (JFET), tunnel field-effect transistor (TFET), or some other similar type of metal-oxide-semiconductor (MOS) device. The metal oxide semiconductor refers to the gate part of the transistor. Substrate 108 can be a refractor type material that can withstand extended high temperature soaks in excess of 1000° C. in corrosive environments and have an amorphous surface structure rather than a very ordered crystalline structure typical on conventional silicon substrates. In an example, substrate 108 may be a refractory ceramic substrate.

Current transistor geometries do not allow for very much perimeter area as the channels cannot be very close together due to some type of spacer material that needs to be between the channels. This can limit the density of the channel and does not allow for very many channels. Hence, as the amount of current that can be passed through the transistor is proportional to the circumference area of the channels, the available current can be limited. Nanowire channel 106 can be configured to use nanowires a few atoms thick and a channel can include about thirty (30) to sixty (60) nanowires of extremely thin material (e.g., less than about 15 angstroms in thickness). This can increase the density of the channel and increase the amount of current that can be passed through a transistor.

Figure 2:
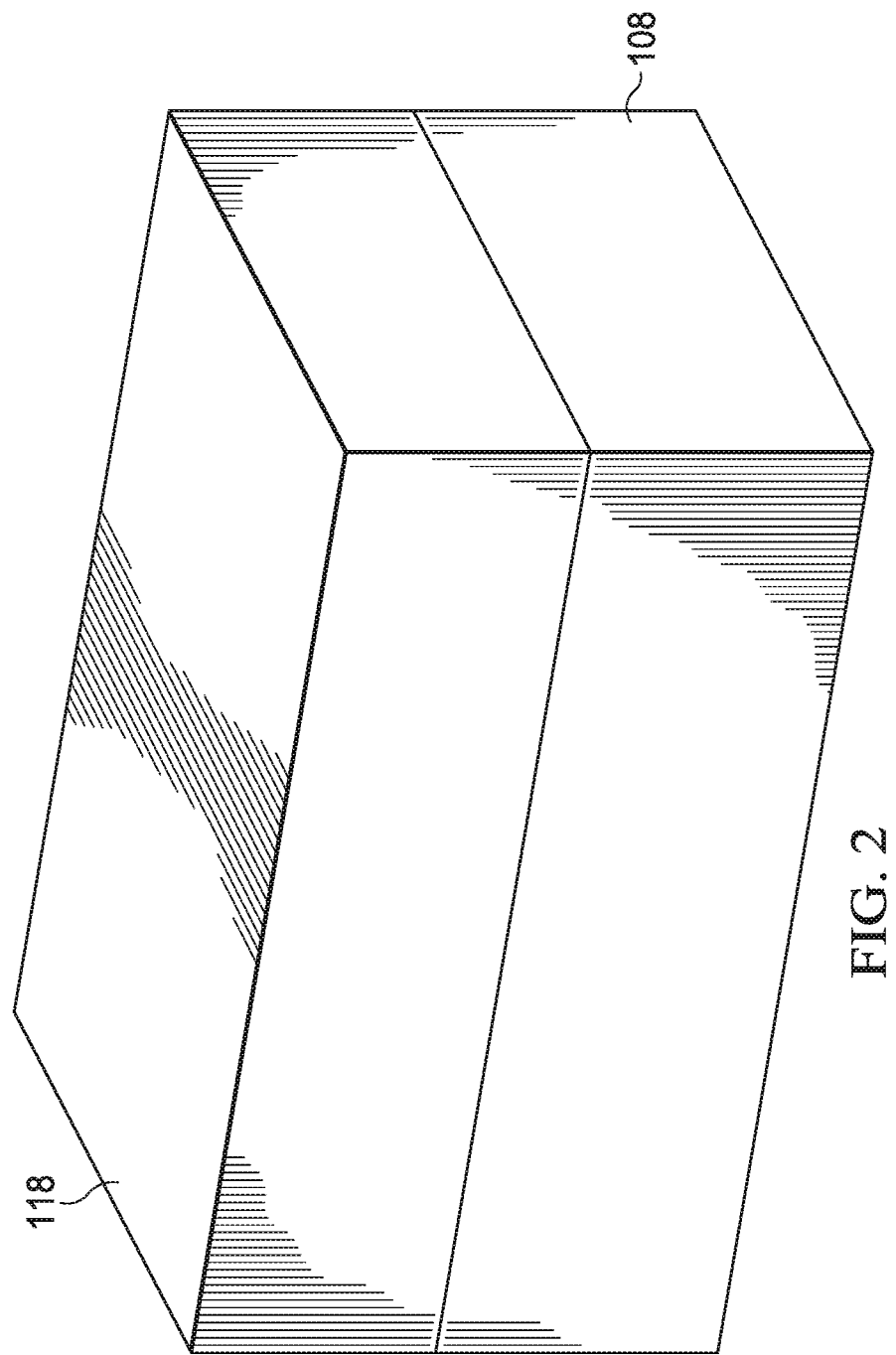
FIG. 2 is a simplified block diagram illustrating an embodiment of a portion of an electronic device, in accordance with one embodiment of the present disclosure.

Turning to FIG. 2, FIG. 2 illustrates a simplified block diagram of an early stage in the formation of nanowire channel 106 in accordance with an embodiment of the present disclosure. As illustrated in FIG. 2, MAX material 118 can be deposited on a substrate 108. MAX material 118 may be deposited using a spin-on deposition from slurry, sputtering, CVD or any combination, or some other form of deposition that can deposit MAX material 118 on substrate 108. MAX material 118 can include a metal (the "M" in MAX) or combination of metals typically with high melting points such as Mo, W, Ti, Sc, Zr, Ta, Nb etc. MAX material 118 can also include a sacrificial material such as aluminum (the "A" in MAX) but could also include other "soft" metals such as column I, II, or III elements in the periodic table (e.g., sodium, calcium, gallium, etc). MAX material 118 can also include carbon or nitrogen or both (the "X" in MAX).

MAX Phases form a large family of ternary carbides with the general formula Mn+1AXn, where n=1-3, M is an early transition metal, A is an A-group element (mostly IIIA and IVA), and X is C and/or N. These phases are layered hexagonal compounds and belong to to space group D6h 4-P63/mmc), with two formula units per unit cell. The MAX phases can be classified according to their values of n: "211" for M2AX (n=1), "312" for M3AX2 (n=2), and "413" for M4AX3 (n=3). Currently, about sixty MAX Phases have been discovered and more will be discovered and should be included in the scope of this application as pertaining to microelectronic devices for logic, memory, graphical processing, etc.

Figure 3:
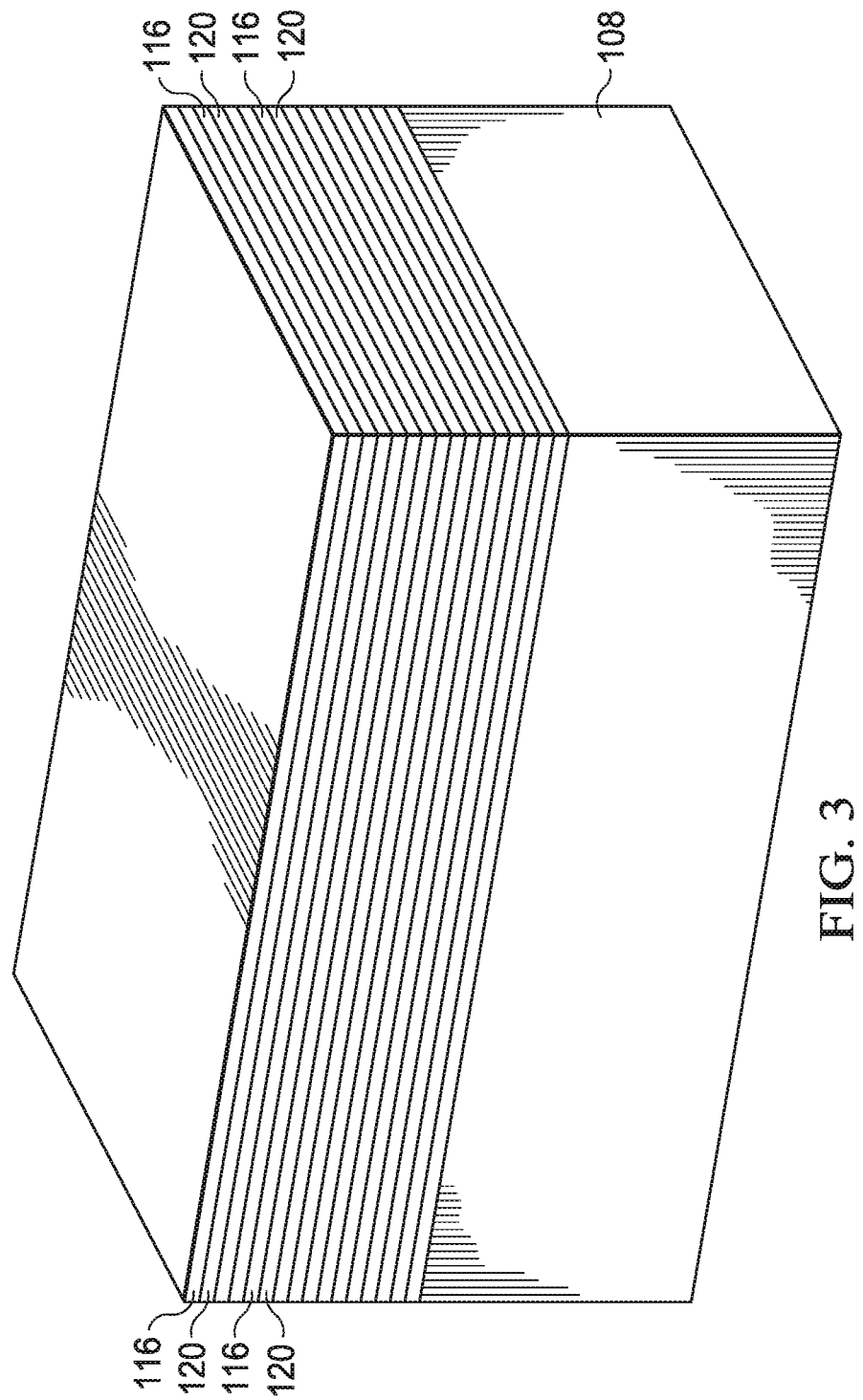
FIG. 3 is a simplified block diagram illustrating an embodiment of a portion of an electronic device, in accordance with one embodiment of the present disclosure.

Turning to FIG. 3, FIG. 3 illustrates a simplified block diagram of an early stage in the formation of nanowire channel 106 in accordance with an embodiment of the present disclosure. MAX material 118 and a substrate 108 may undergo a thermal treatment to create or enhance the self-ordered nature of MAX material 118. MAX material 118 can be a multilayer structure and may include planarization. The thermal treatment can include extended high temperature soaks in excess of 1000° C. in corrosive environments. After the thermal treatment, MAX material 118 can become ordered into alternating layers of nanowire 116 (e.g., metal layers) and sacrificial material 120. In an example embodiment the MAX phase is a single crystal across the entire substrate. In another embodiment the MAX phase contains grain boundaries, however the planes are still primarily oriented parallel to the substrate. In yet another embodiment each individual layer is a plane with periodic or random breaks in its continuity but the discontinuities are not lined up from one planar unit to another.

Figure 4:
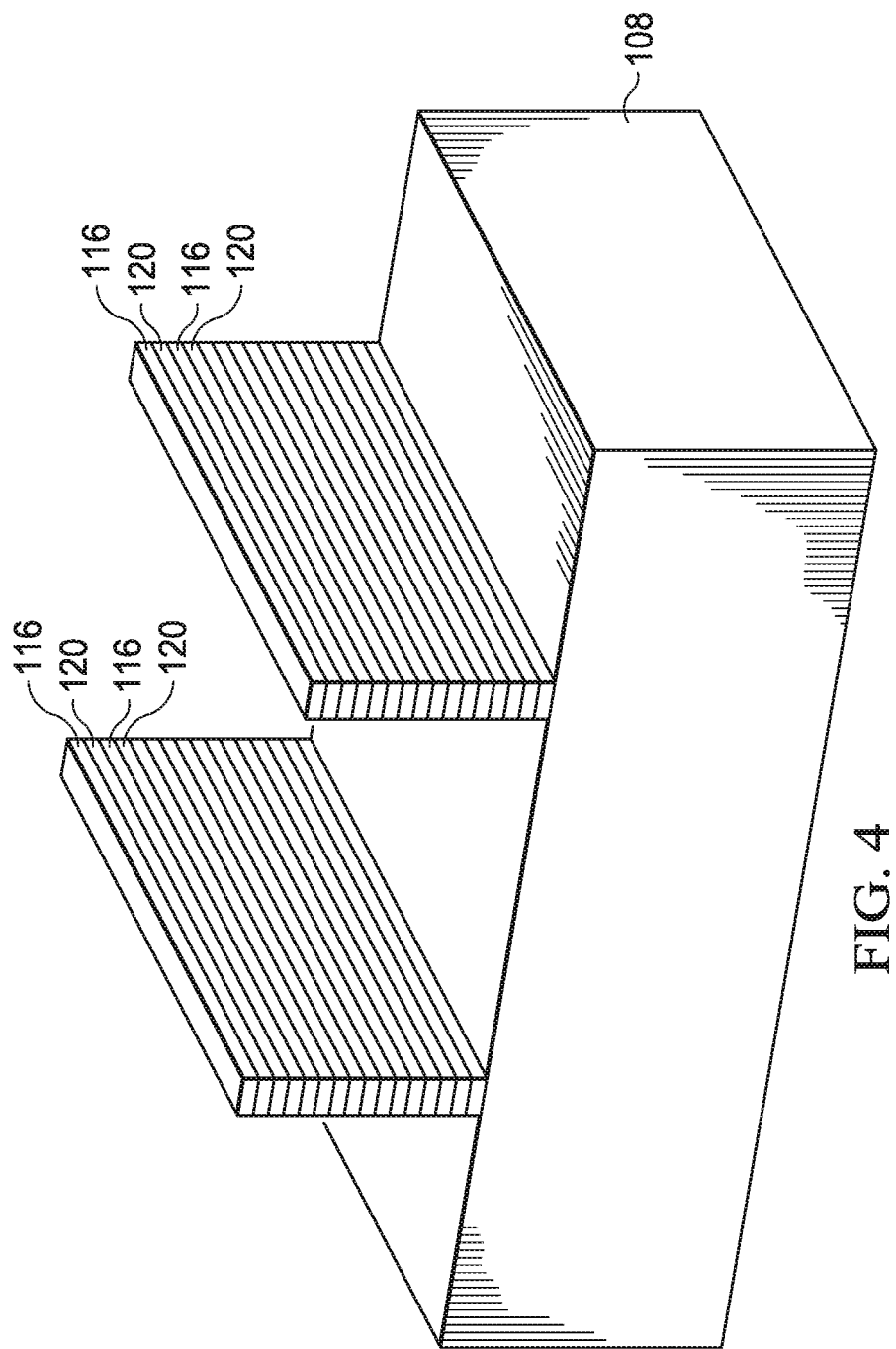
FIG. 4 is a simplified block diagram illustrating an embodiment of a portion of an electronic device, in accordance with one embodiment of the present disclosure.

Turning to FIG. 4, FIG. 4 illustrates a simplified block diagram of an early stage in the formation of nanowire channel 106 in accordance with an embodiment of the present disclosure. As illustrated in FIG. 4, patterning such as lithography and etching (e.g., similar to shallow trench recess (STR) in silicon trigate technology) may be used to create fins of MAX material 118. Each fin of MAX material 118 can include alternating layers of nanowire 116 and sacrificial material 120.

Figure 5:
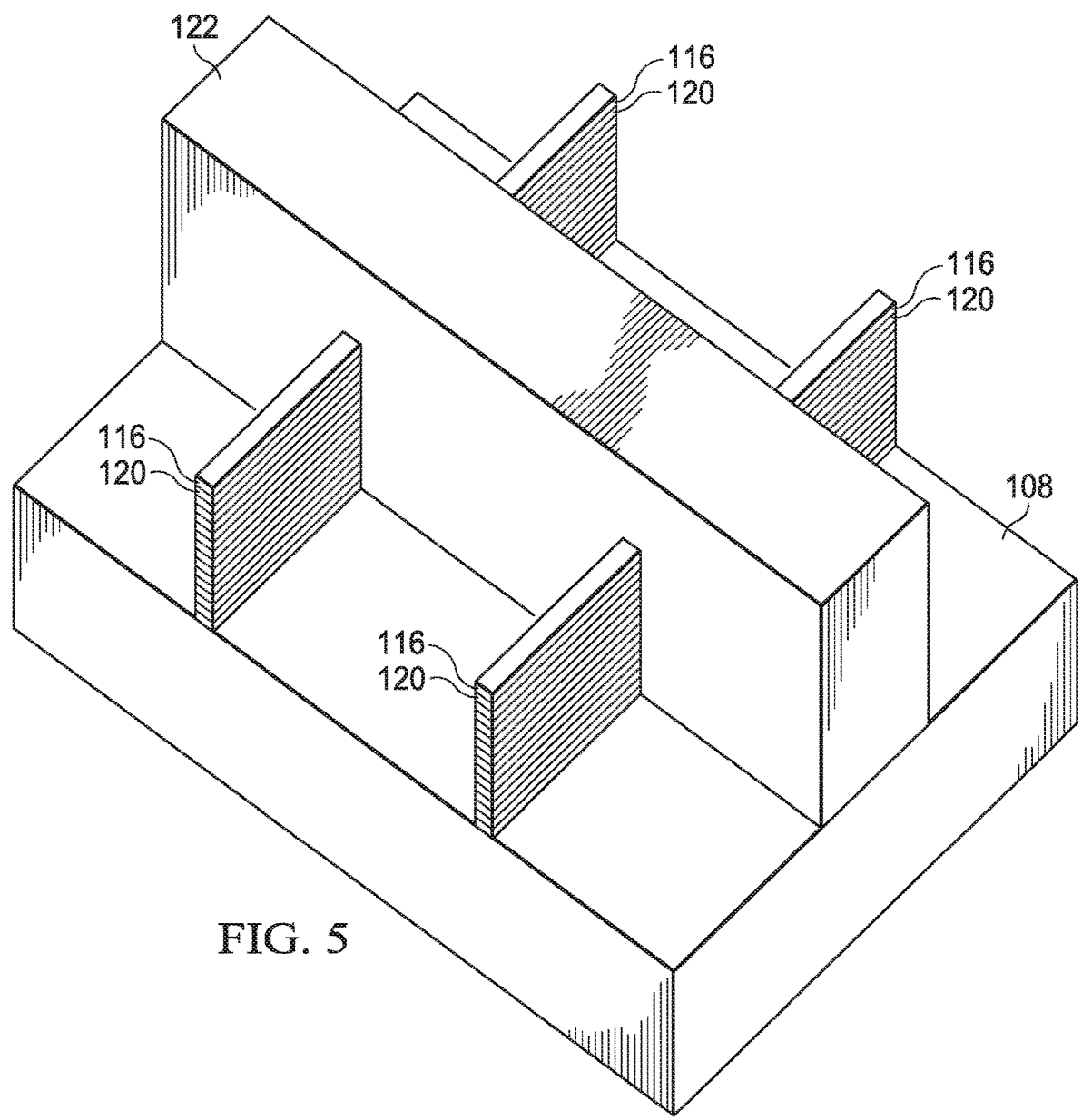
FIG. 5 is a simplified block diagram illustrating an embodiment of a portion of an electronic device, in accordance with one embodiment of the present disclosure.

Turning to FIG. 5, FIG. 5 illustrates a simplified block diagram of an early stage in the formation of nanowire channel 106 in accordance with an embodiment of the present disclosure. As illustrated in FIG. 5, a dummy gate 122 can be added to a portion of each fin of MAX material 118. Each fin of MAX material 118 can include alternating layers of nanowire 116 and sacrificial material 120. Dummy gate 122 may be a dummy gate insulator and dummy gate electrode and can be processed using deposition, patterning, etc. The term "dummy" refers to a replacement gate flow. In an example, the process can include depositing SiO2 and polysilicon and then later removing the SiO2 and polysilicon and replacing it with a high K insulator and a metal gate. In this case the rationale for replacement gate processing is that the gate spacer as well as source/drain layers are firmly attached to the substrate and physically hold the thin layers of channel material in place during and after the sacrificial material etch.

When fabricating nanowire channel 106 with a gate, it does not matter if the gate is done first or last. For example, a MOS device is composed of a source, channel, gate around the channel, and a drain on the other side. If a gate first process is used, then dummy gate 122 would be a high K insulator and a metal gate. Whether a real gate or a dummy gate is used, dummy gate 122 can define the structure and where a channel portion of the transistor is located. What is not the channel portion can be allowed to become a source and a drain. The source/drain can be created using almost any process and can be replaced with some kind of metallic material or as a wraparound source/drain. The point is to identify where the contacts will be located.

Figure 6:
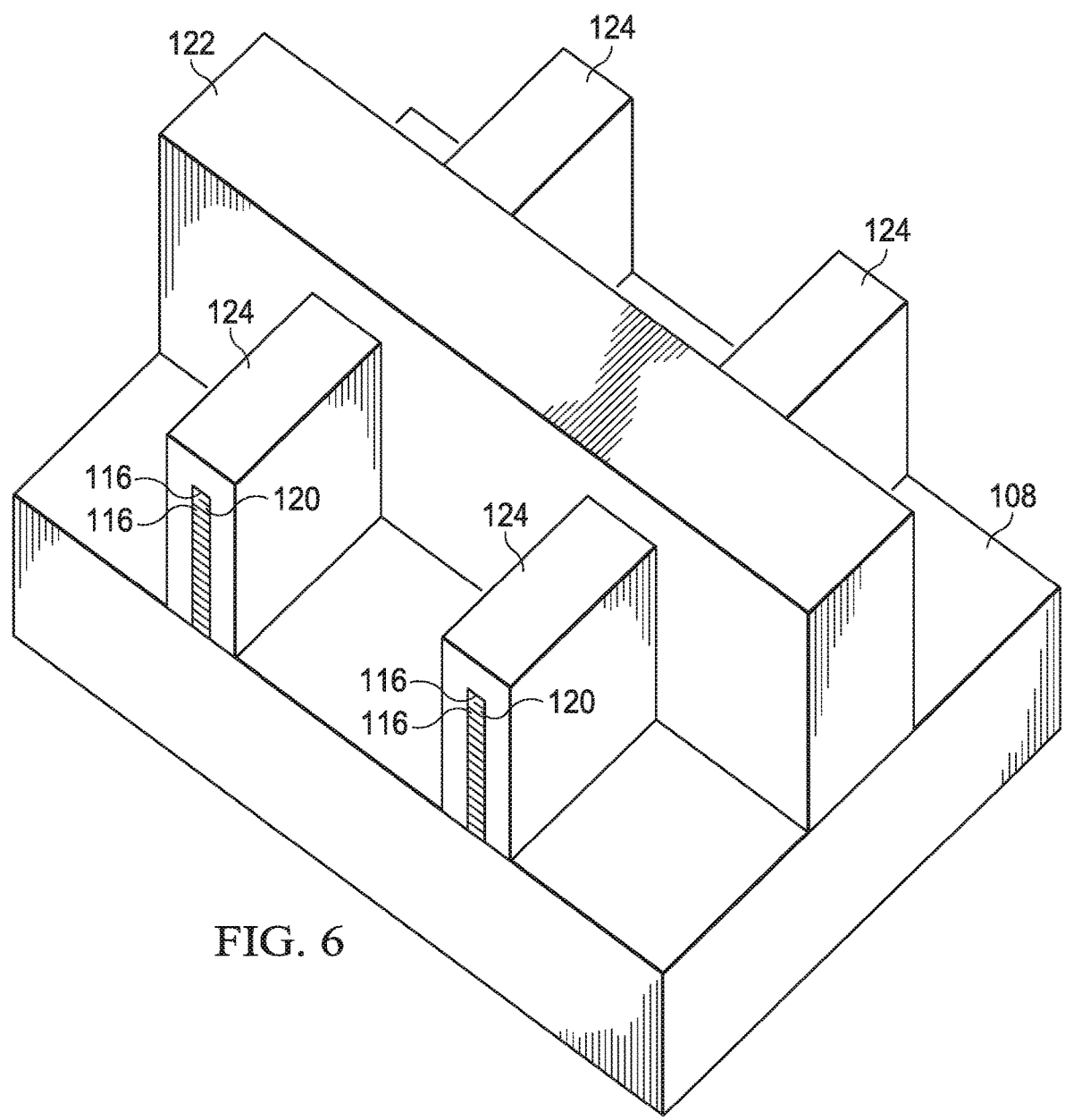
FIG. 6 is a simplified block diagram illustrating an embodiment of a portion of an electronic device, in accordance with one embodiment of the present disclosure.

Turning to FIG. 6, FIG. 6 illustrates a simplified block diagram of a stage in the formation of nanowire channel 106 in accordance with an embodiment of the present disclosure. As illustrated in FIG. 6, source/drain processing may be performed on the exposed nanowire 116 and sacrificial material 120. As a result of the source/drain processing, nanowire 116 and sacrificial material 120 may be covered by source/drain material 124. In one embodiment, source/drain material 124 may be replaced by or wrapped with a metallic carbide or nitride material such as TiN, TaN or a metal like W, Ni or Cu. In another embodiment, source/drain material 124 could remain and after gate processing, source/drain material 124 can either be replaced or a wraparound process may be used for the source/drain.

Figure 7:
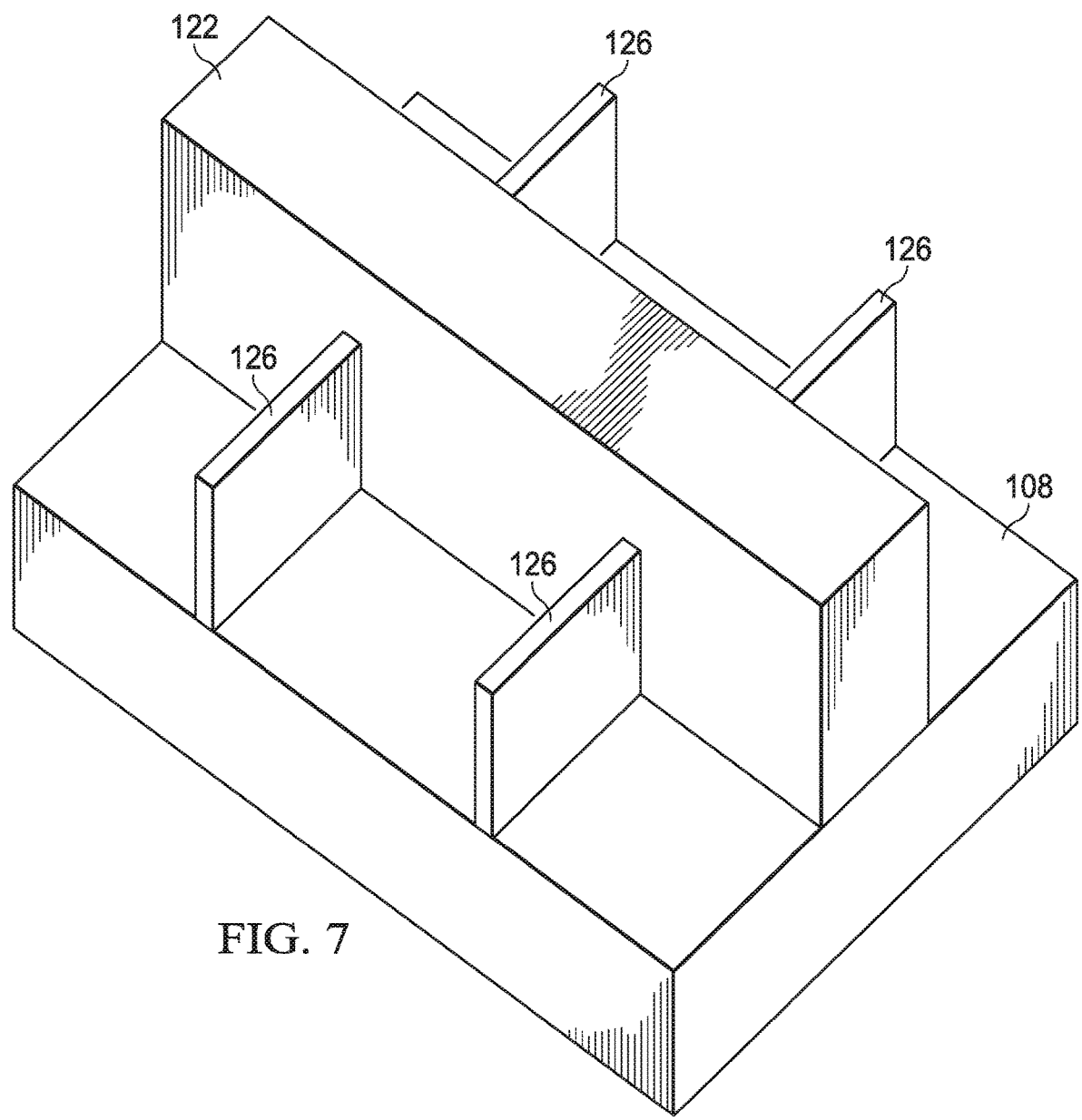
FIG. 7 is a simplified block diagram illustrating an embodiment of a portion of an electronic device, in accordance with one embodiment of the present disclosure.

Turning to FIG. 7, FIG. 7 illustrates a simplified block diagram of a stage in the formation of nanowire channel 106 in accordance with an embodiment of the present disclosure.

Figure 13:
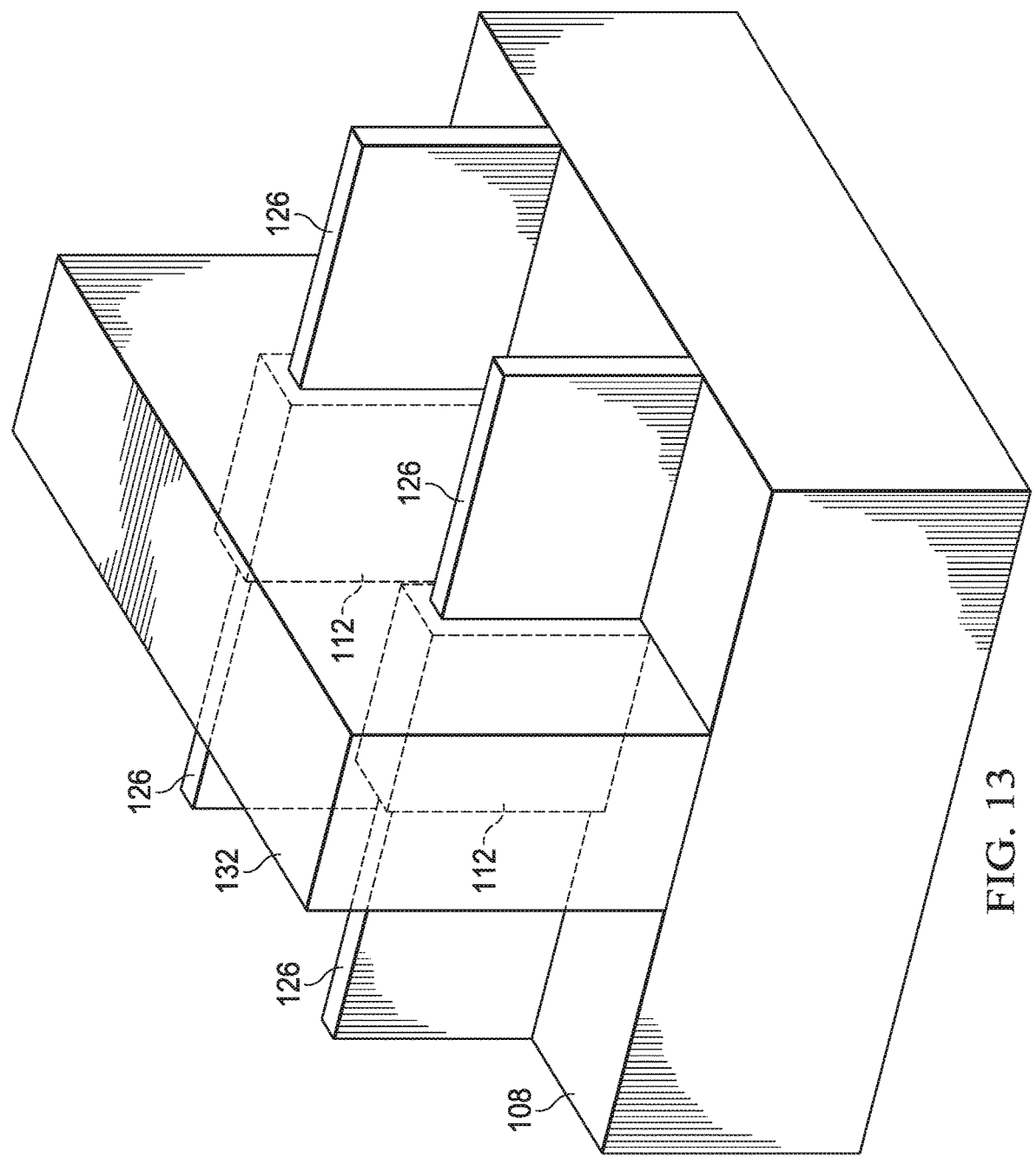
FIG. 13 is a simplified block diagram illustrating an embodiment of a portion of an electronic device, in accordance with one embodiment of the present disclosure.

In an embodiment, the exposed nanowire 116 and sacrificial material 120 may be etched away and source/drain processing may be performed. For example, as illustrated in FIG. 7, the exposed nanowire 116, sacrificial material 120, and anything that is not protected by dummy gate 122 was etched away and replaced with temporary source/drain material 126 (e.g., an epitaxial replacement source/drain). In an example, plugs or contacts added later (e.g., see FIG. 14) can contact with the area around temporary source/drain material 126. In another embodiment, source/drain processing occurs here, rather than after gate processing, as illustrated in FIG. 13.

Figure 8:
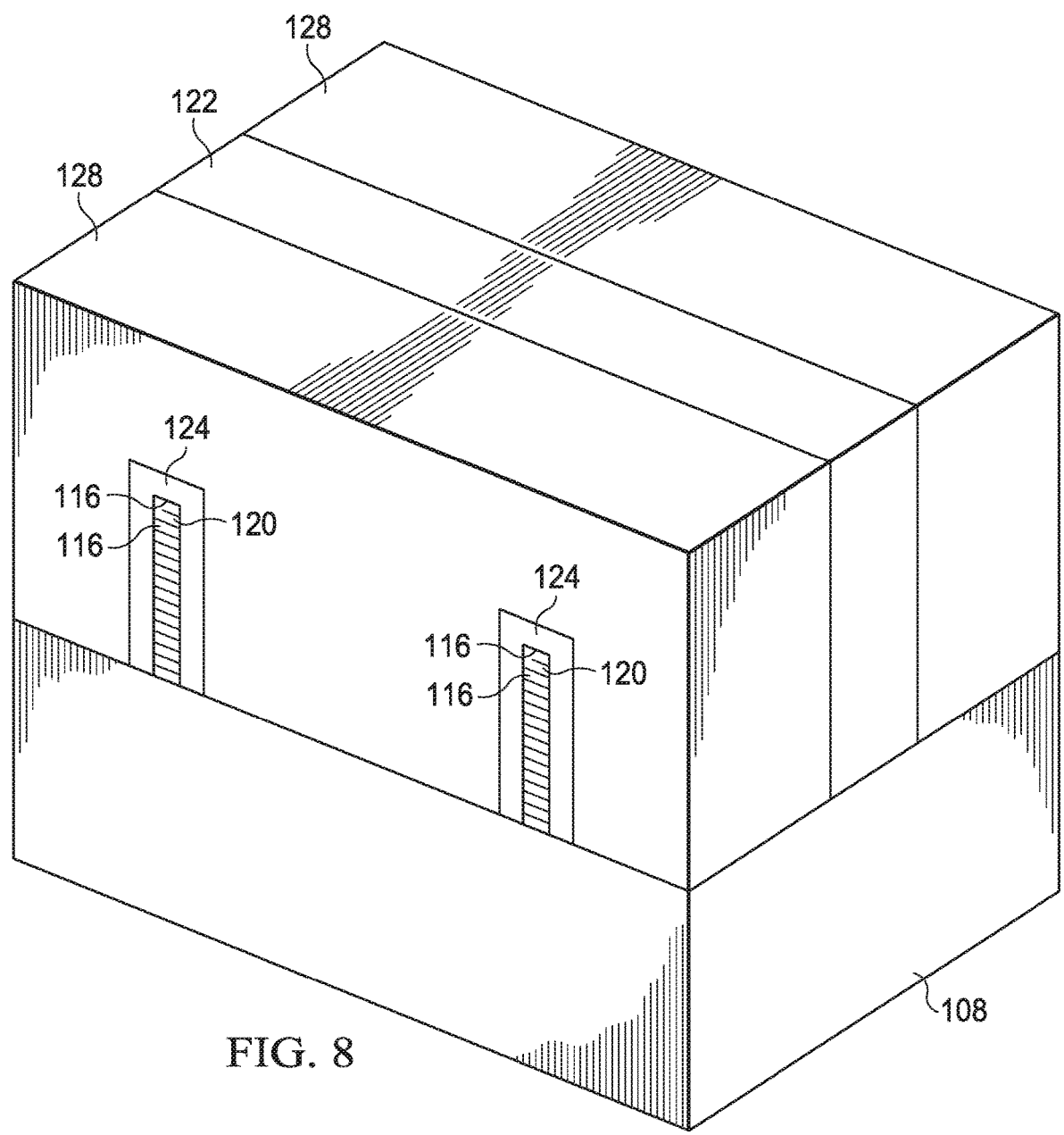
FIG. 8 is a simplified block diagram illustrating an embodiment of a portion of an electronic device, in accordance with one embodiment of the present disclosure.

Turning to FIG. 8, FIG. 8 illustrates a simplified block diagram of a stage in the formation of nanowire channel 106 in accordance with an embodiment of the present disclosure. As illustrated in FIG. 8, a contact insulator 128 can be deposited to isolate the source/drain regions or the region around source/drain material 124. Contact insulator 128 may be an oxide or some other similar type material. In an example, contact insulator 128 can be planarized to the top of dummy gate 122.

Figure 9:
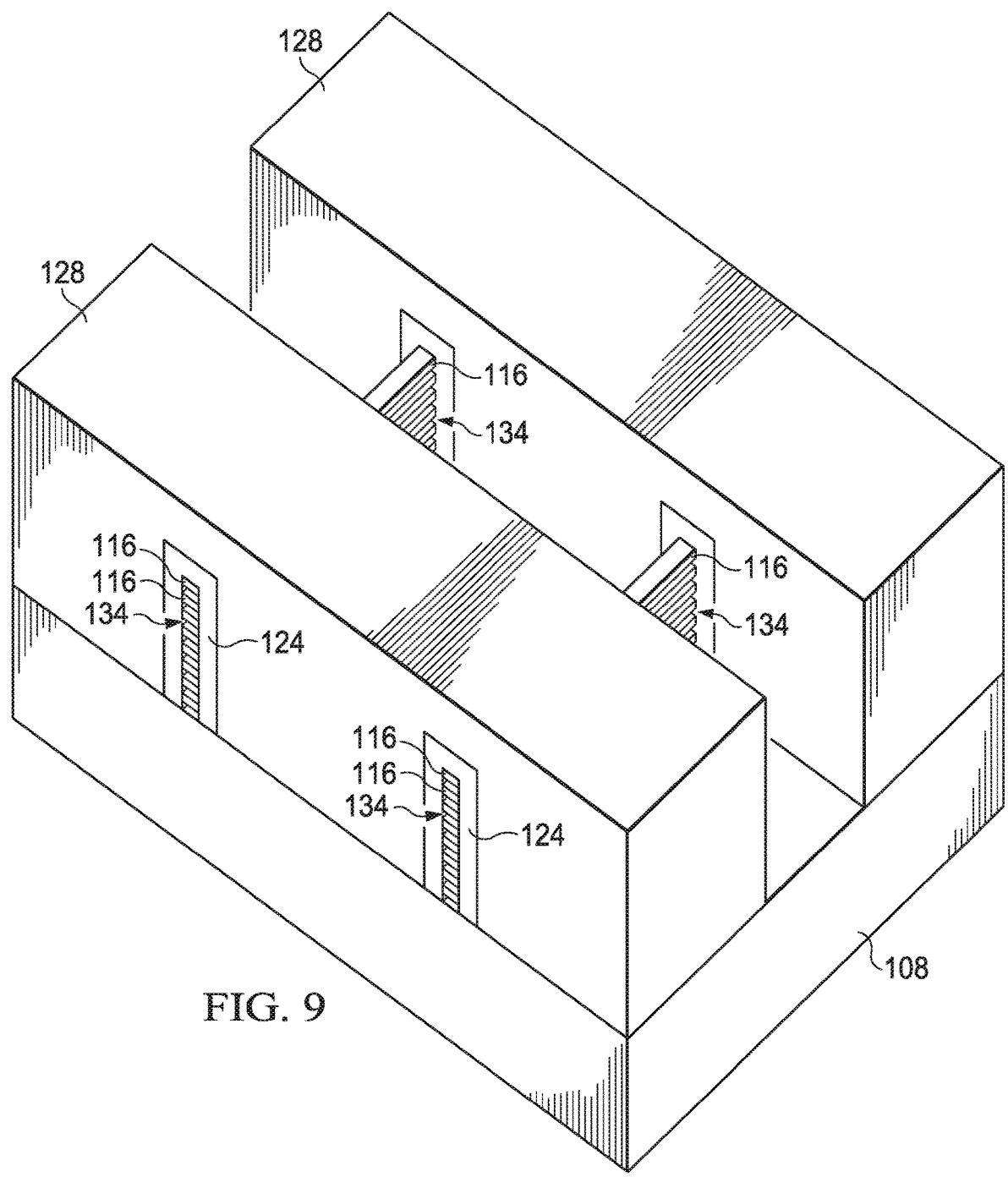
FIG. 9 is a simplified block diagram illustrating an embodiment of a portion of an electronic device, in accordance with one embodiment of the present disclosure.

Turning to FIG. 9, FIG. 9 illustrates a simplified block diagram of a stage in the formation of nanowire channel 106 in accordance with an embodiment of the present disclosure. As illustrated in FIG. 9, dummy gate 122 has been removed. This re-exposes nanowires 116 and sacrificial material 120. Sacrificial material 120 is aluminum or some other softer, low melting point metal oxide/carbide/nitride material that can be etched out to leave layers of nanowire 116.

Figure 10:
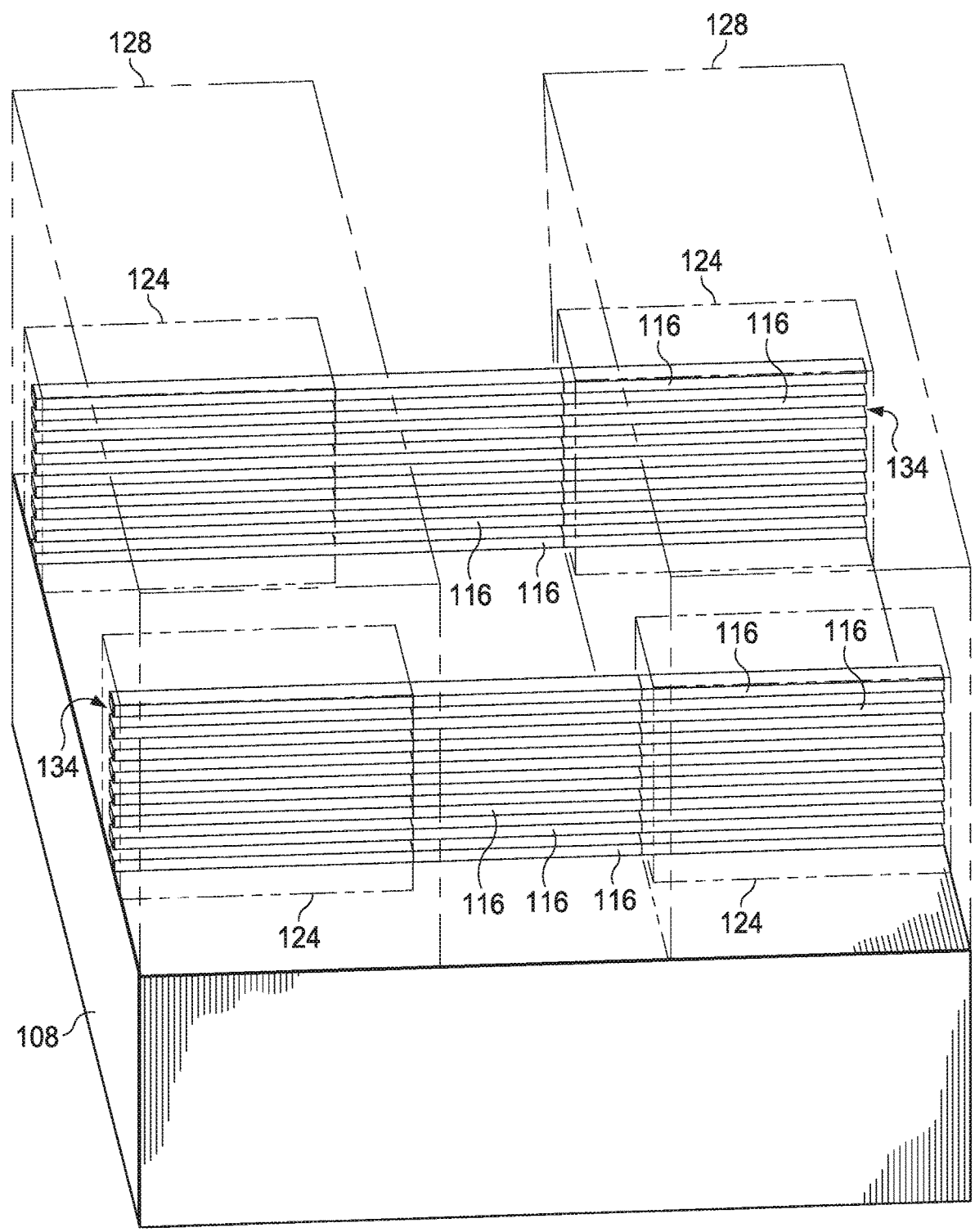
FIG. 10 is a simplified block diagram illustrating an embodiment of a portion of an electronic device, in accordance with one embodiment of the present disclosure.

Turning to FIG. 10, FIG. 10 illustrates a simplified block diagram of an early stage in the formation of nanowire channel 106 in accordance with an embodiment of the present disclosure. As illustrated in FIG. 10, sacrificial material 120 has been removed leaving just nanowires 116 in the area previously occupied by dummy gate 122. A distance 134 between each nanowire 116 can be about the thickness of sacrificial material 120 which is about 15 angstroms or less. In an example, nanowire channel 106 can include more than ten (10) nanowires 116. In another example, nanowire channel 106 can include more than one hundred (100) nanowires 116. This is a dramatic improvement over existing applications where the distance is typically above 15 angstroms and the number of nanowires per transistor is less than 10.

Figure 11:
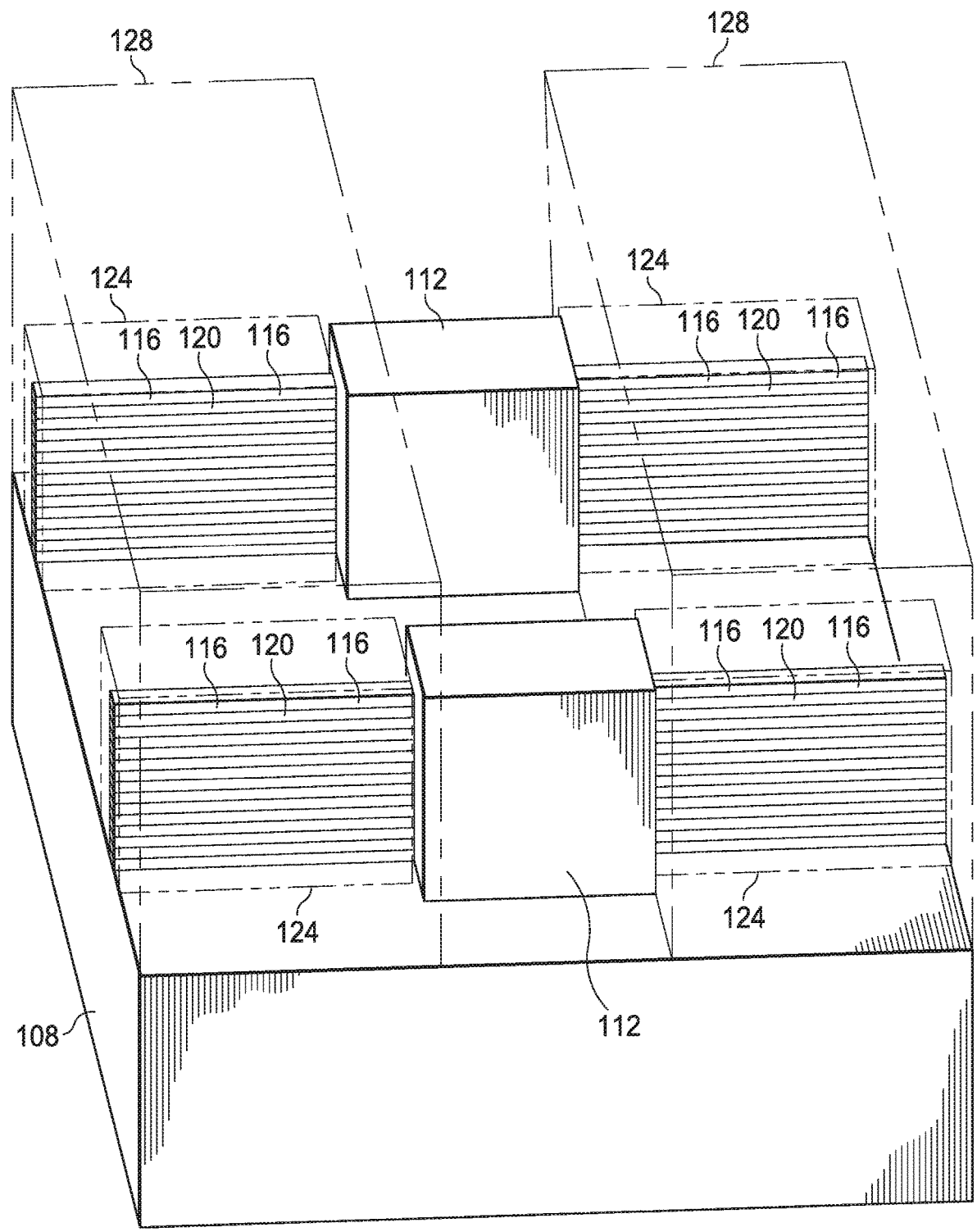
FIG. 11 is a simplified block diagram illustrating an embodiment of a portion of an electronic device, in accordance with one embodiment of the present disclosure.
Figure 12:
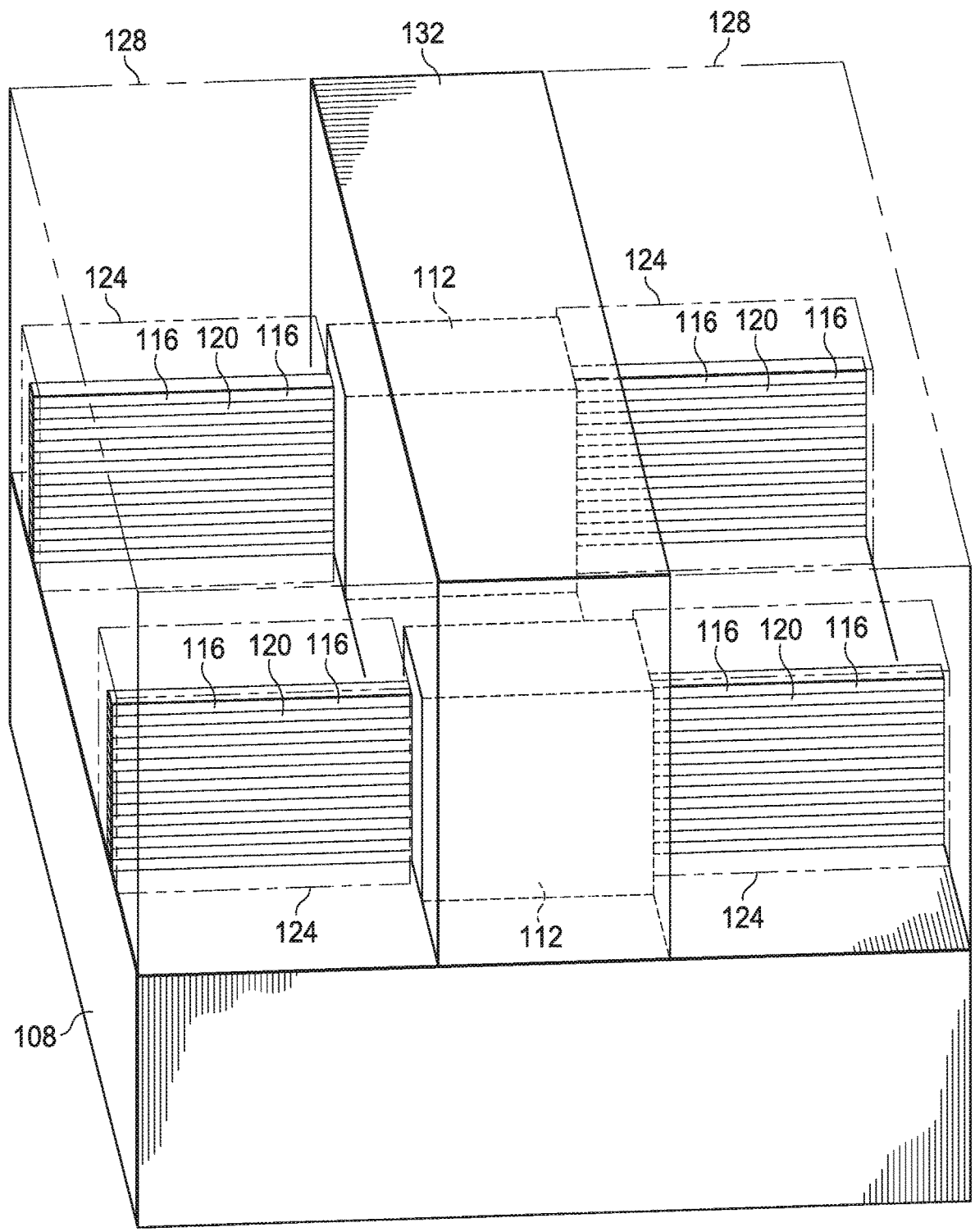
FIG. 12 is a simplified block diagram illustrating an embodiment of a portion of an electronic device, in accordance with one embodiment of the present disclosure.

Turning to FIG. 11, FIG. 11 illustrates a simplified block diagram of a stage in the formation of nanowire channel 106 in accordance with an embodiment of the present disclosure. As illustrated in FIG. 11, insulator 112 can be deposited around nanowires 116. Deposition of insulator 112 would also be present on the walls or surfaces of contact insulator 128 and substrate 108 although they would not serve a gate insulator function in those locations Turning to FIG. 12, FIG. 12 illustrates a simplified block diagram of a stage in the formation of nanowire channel 106 in accordance with an embodiment of the present disclosure. As illustrated in FIG. 12, the remaining space is filled with a metal to create a gate electrode 132. Gate electrode 132 may be a metal gate and control the flow of electrical current between the source and the drain.

Turning to FIG. 13, FIG. 13 illustrates a simplified block diagram of a stage in the formation of nanowire channel 106 in accordance with an embodiment of the present disclosure. As illustrated in FIG. 13, contact insulator 128 can be removed. If source/drain processing was not previously done, as illustrated in FIG. 7, then after contact insulator 128 is removed, source/drain processing can be achieved. Source/drain processing can be done early in the formation of nanowire channel 106, as shown in FIG. 7 or the source/drains can be left with the native channel material and source/drain processing can be performed after all the gates have been processed, as illustrated in FIG. 13.

Figure 14:
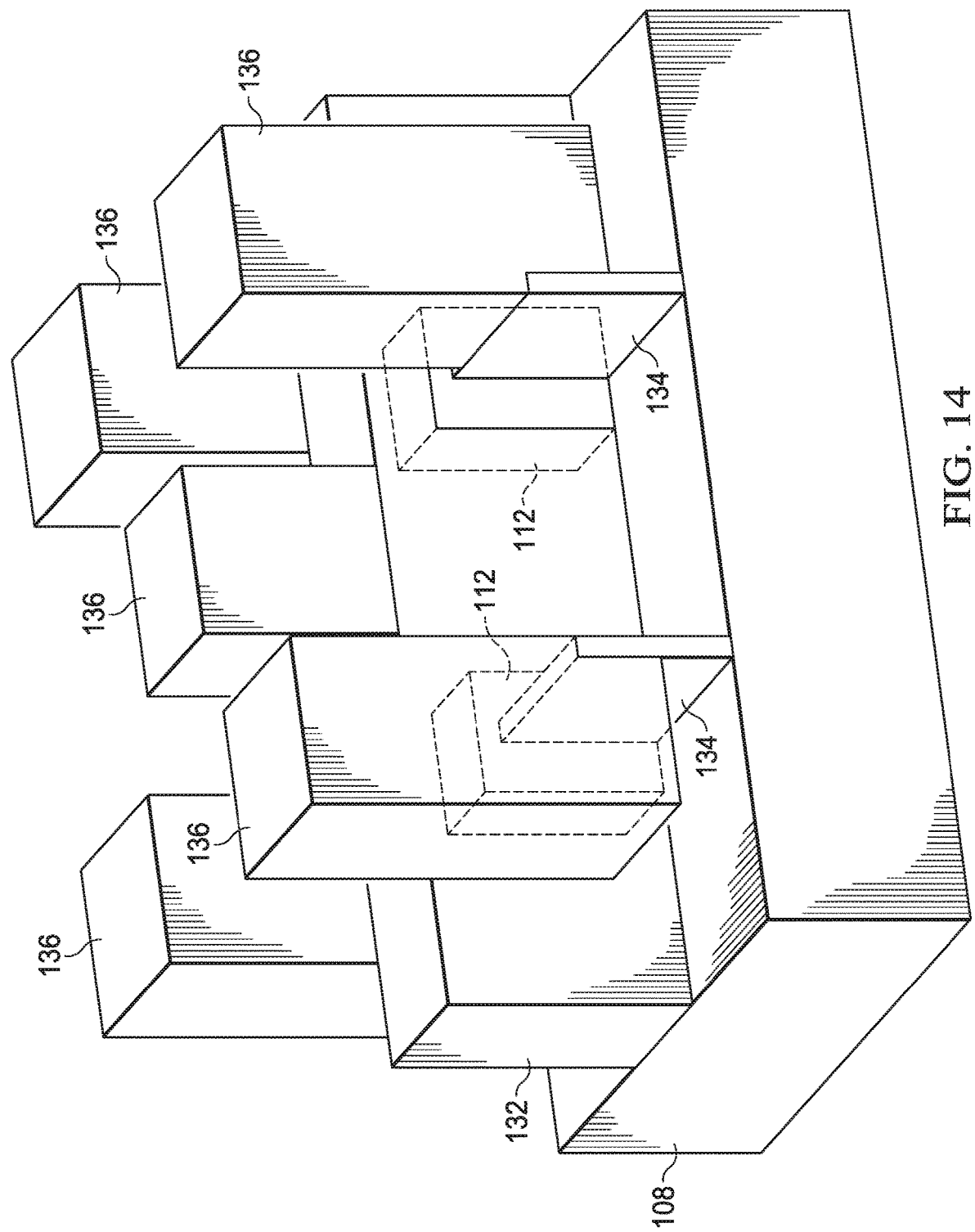
FIG. 14 is a simplified block diagram illustrating an embodiment of a portion of an electronic device, in accordance with one embodiment of the present disclosure.

Turning to FIG. 14, FIG. 14 illustrates a simplified block diagram of a stage in the formation of nanowire channel 106 in accordance with an embodiment of the present disclosure. Contacts 136 can be added and back end flow can be achieved. The addition of contacts and back end flow are well known in the art.

Figure 15:
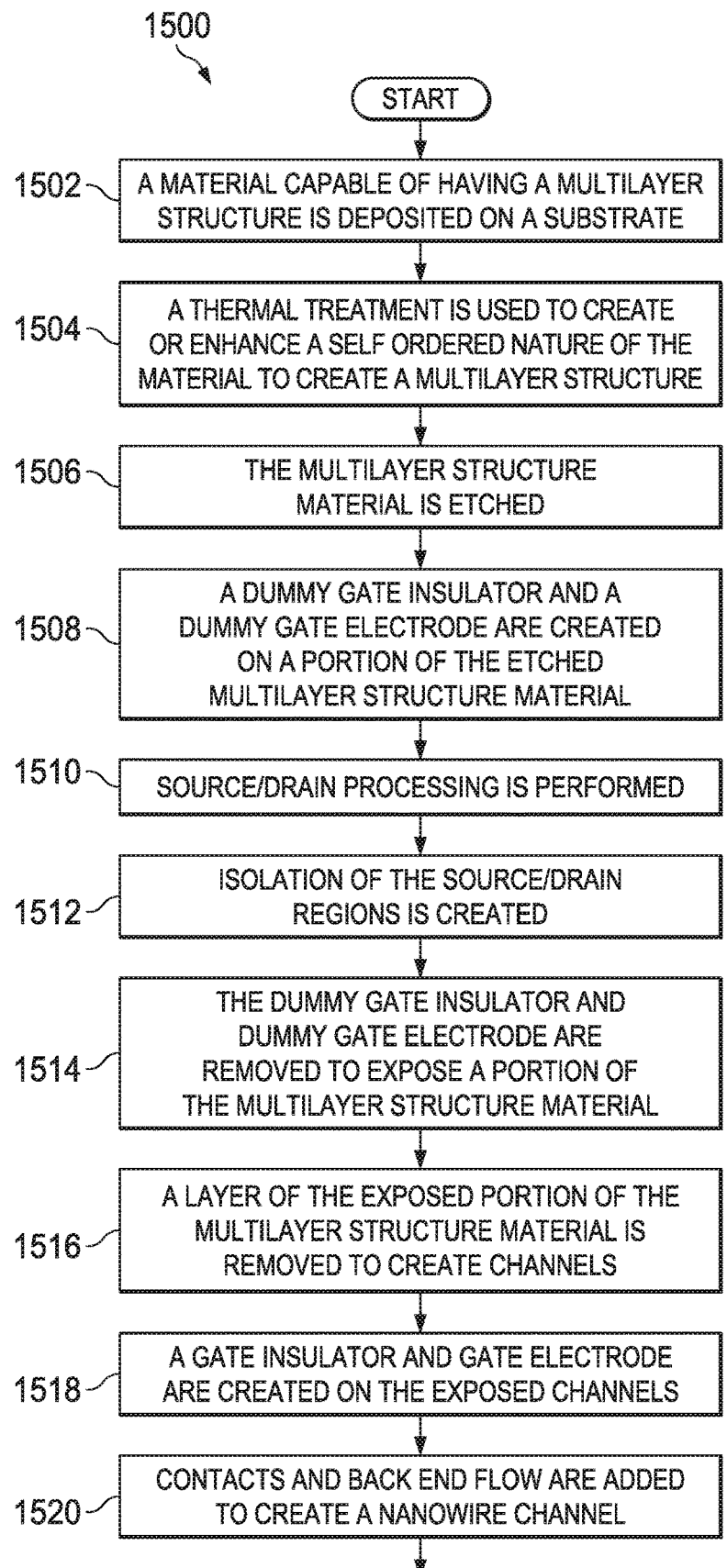
FIG. 15 is a simplified flowchart illustrating potential operations that may be associated with one embodiment of the present disclosure.

Turning to FIG. 15, FIG. 15 is a simplified flowchart illustrating potential operations that may be associated with one embodiment of the present disclosure. At 1502, a material capable of having a multilayer structure is deposited on a substrate. At 1504, a thermal treatment is used to create or enhance a self-ordered nature of the material to create a multilayer structure. At 1506, the multilayer structure material is etched. At 1508, a dummy gate insulator and a dummy gate electrode are created on a portion of the etched multilayer structure material. At 1510, source/drain processing is performed. At 1512, isolation of the source/drain regions is created. At 1514, the dummy gate insulator and dummy gate electrode are removed to expose a portion of the multilayer structure material. At 1516, a layer of the exposed portion of the multilayer structure material is removed to create channels. At 1518, a gate insulator and gate electrode are created on the exposed channels. At 1520, contacts and back end flow are added to create a nanowire channel.

Figure 16:
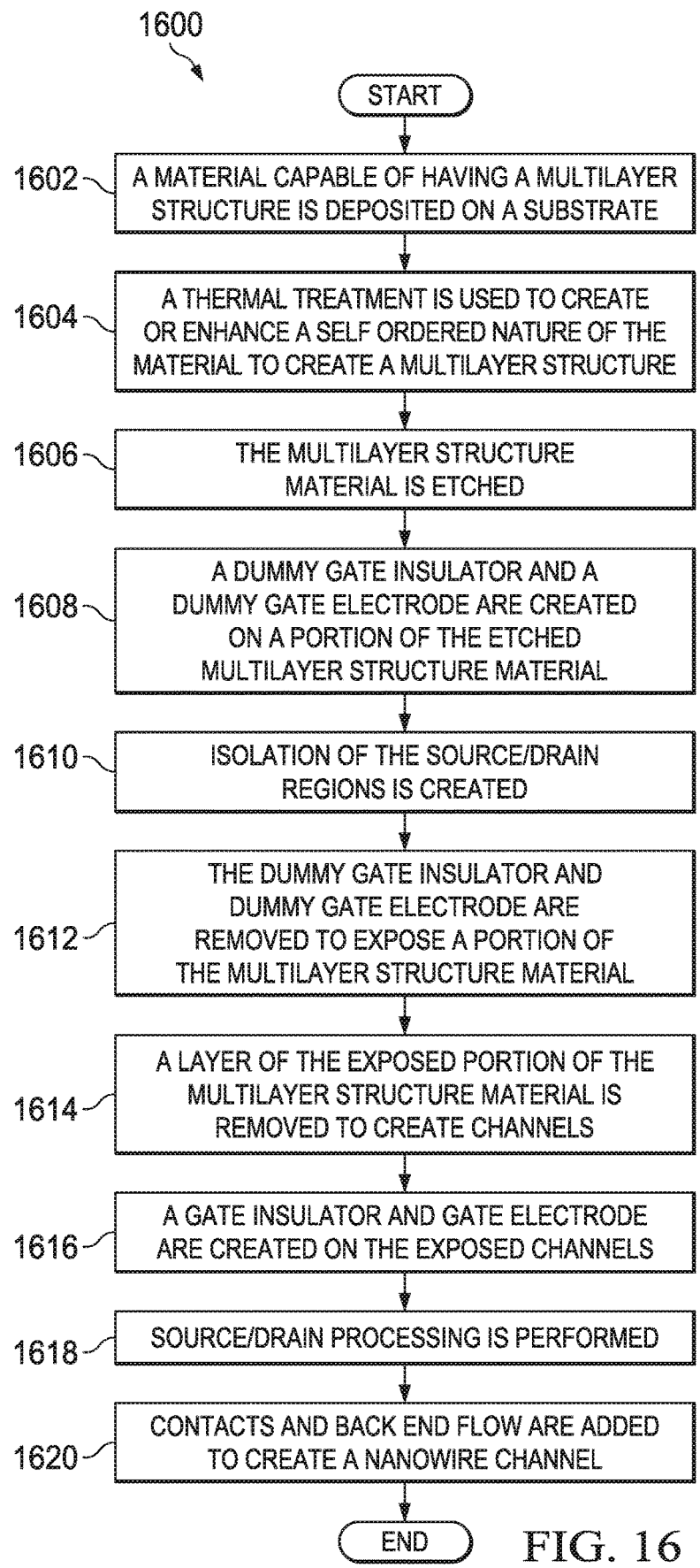
FIG. 16 is a simplified flowchart illustrating potential operations that may be associated with one embodiment of the present disclosure.

Turning to FIG. 16, FIG. 16 is a simplified flowchart illustrating potential operations that may be associated with one embodiment of the present disclosure. At 1602, a material capable of having a multilayer structure is deposited on a substrate. At 1604, a thermal treatment is used to create or enhance a self-ordered nature of the material to create a multilayer structure. At 1606, the multilayer structure material is etched. At 1608, a dummy gate insulator and a dummy gate electrode are created on a portion of the etched multilayer structure material. At 1610, isolation of the source/drain regions is created. At 1612, the dummy gate insulator and dummy gate electrode are removed to expose a portion of the multilayer structure material. At 1614, a layer of the exposed portion of the multilayer structure material is removed to create channels. At 1616, a gate insulator and gate electrode are created on the exposed channels. At 1618, source/drain processing is performed. At 16 source/drain processing is performed 20, contacts and back end flow are added to create a nanowire channel.

In an example, a plurality of transistors, such as metal-oxide-semiconductor field-effect transistors (MOSFET or simply MOS transistors), may be fabricated on a substrate (e.g., substrate, 108). In various implementations, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the features, examples, and embodiments discussed herein may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

Figure 17:
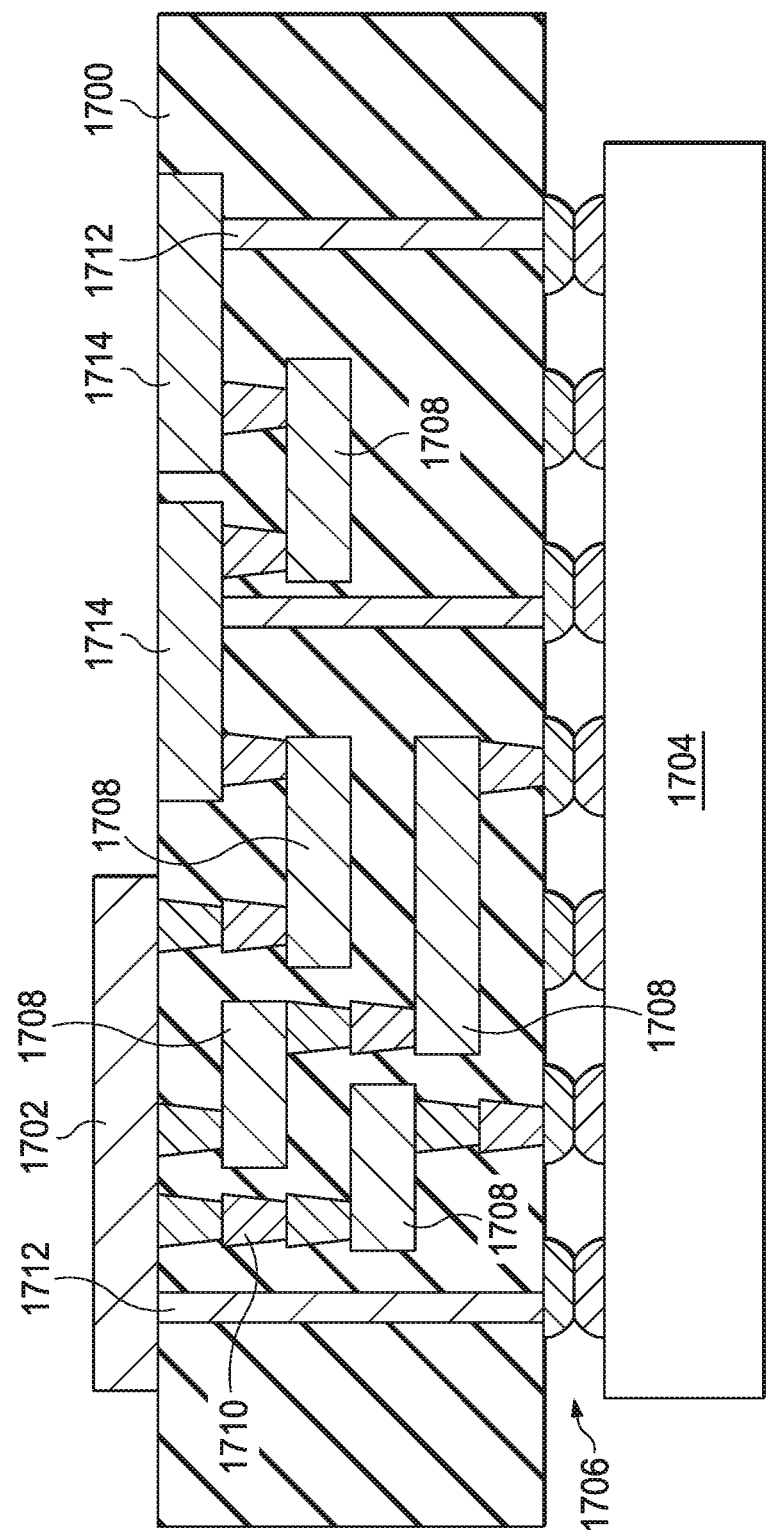
FIG. 17 is an interposer implementing one or more of the embodiments disclosed herein.

Turning to FIG. 17, FIG. 17 illustrates an interposer 1700 that can include or interact with one or more embodiments disclosed herein. The interposer 1700 is an intervening substrate used to bridge a first substrate 1702 to a second substrate 1704. The first substrate 1702 may be, for instance, an integrated circuit die. The second substrate 1704 may be, for instance, a memory module, a computer motherboard, or another integrated circuit die. Generally, the purpose of an interposer 1700 is to spread a connection to a wider pitch or to reroute a connection to a different connection. For example, an interposer 1700 may couple an integrated circuit die to a ball grid array (BGA) 1706 that can subsequently be coupled to the second substrate 1704. In some embodiments, the first and second substrates 1702/1704 are attached to opposing sides of the interposer 1700. In other embodiments, the first and second substrates 1702/1704 are attached to the same side of the interposer 1700. And in further embodiments, three or more substrates are interconnected by way of the interposer 1700.

The interposer 1700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a refractory ceramic substrate or a refractory ceramic substrate and a semiconductor substrate, such as silicon, germanium, and other group III-V and group IV materials.

The interposer may include metal interconnects 1708 and vias 1710, including but not limited to through-silicon vias (TSVs) 1712. The interposer 1700 may further include embedded devices 1714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1700. In accordance with various embodiments, apparatuses or processes disclosed herein may be used in the fabrication of interposer 1700.

Figure 18:
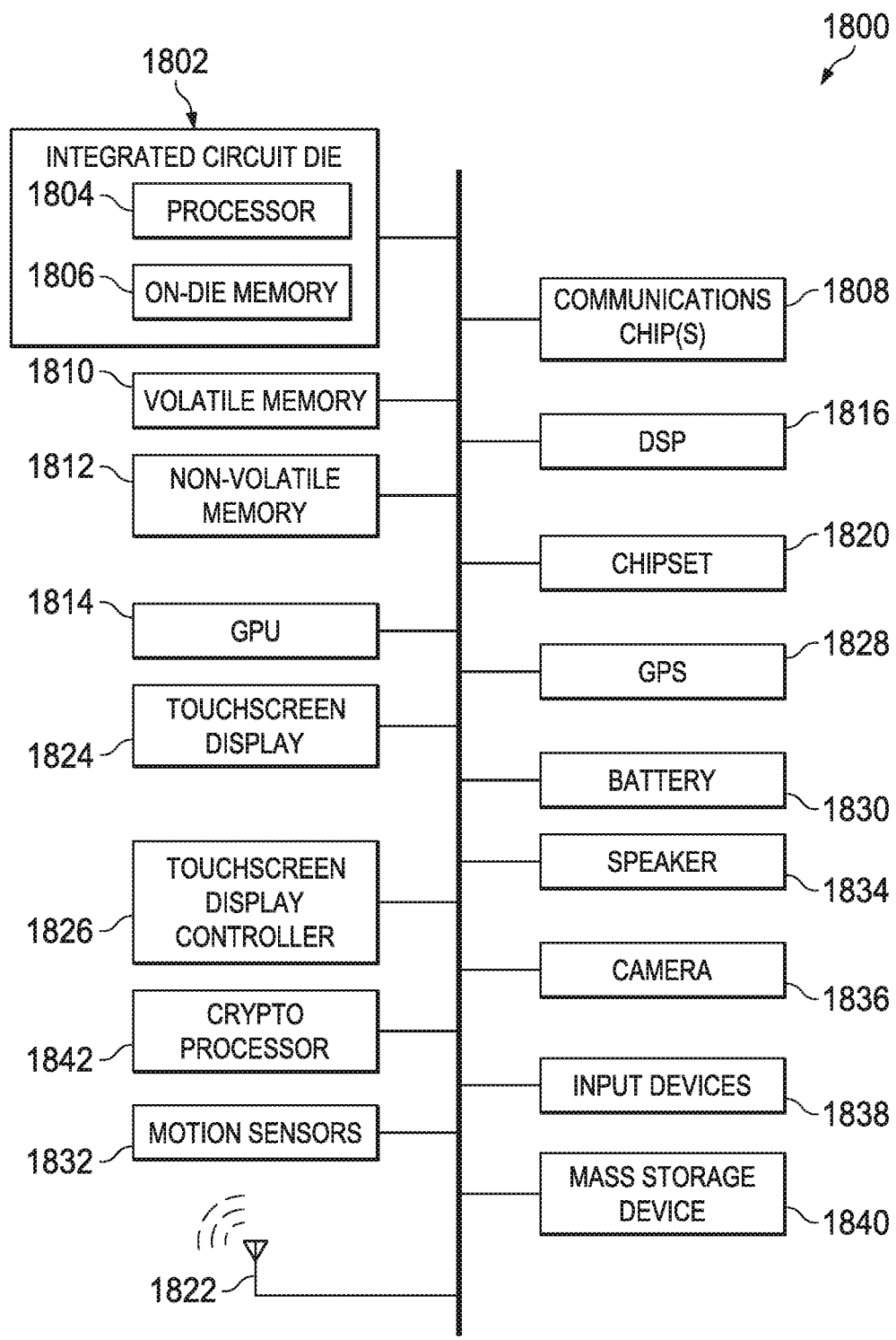
FIG. 18 is a computing device built in accordance with an embodiment disclosed herein.

Turning to FIG. 18, FIG. 18 illustrates a computing device 1800 in accordance with various embodiments. The computing device 1800 may include a number of components. In one embodiment, these components are attached to one or more motherboards. In an alternate embodiment, some or all of these components are fabricated onto a single system-on-a-chip (SoC) die. The components in the computing device 1800 include, but are not limited to, an integrated circuit die 1802 and at least one communications logic unit 1808. In some implementations the communications logic unit 1808 is fabricated within the integrated circuit die 1802 while in other implementations the communications logic unit 1808 is fabricated in a separate integrated circuit chip that may be bonded to a substrate or motherboard that is shared with or electronically coupled to the integrated circuit die 1802. The integrated circuit die 1802 may include a CPU 1804 as well as on-die memory 1806, often used as cache memory, that can be provided by technologies such as embedded DRAM (eDRAM) or spin-transfer torque memory (STTM or STT-MRAM).

Computing device 1800 may include other components that may or may not be physically and electrically coupled to the motherboard or fabricated within an SoC die. These other components include, but are not limited to, volatile memory 1810 (e.g., DRAM), non-volatile memory 1812 (e.g., ROM or flash memory), a graphics processing unit 1814 (GPU), a digital signal processor 1816, a crypto processor 1842 (a specialized processor that executes cryptographic algorithms within hardware), a chipset 1820, an antenna 1822, a display or a touchscreen display 1824, a touchscreen controller 1826, a battery 1828 or other power source, a power amplifier (not shown), a voltage regulator (not shown), a global positioning system (GPS) device 1828, a compass 1830, a motion coprocessor or sensors 1832 (that may include an accelerometer, a gyroscope, and a compass), a speaker 1834, a camera 1836, user input devices 1838 (such as a keyboard, mouse, stylus, and touchpad), and a mass storage device 1840 (such as hard disk drive, compact disk (CD), digital versatile disk (DVD), and so forth).

The communications logic unit 1808 enables wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1800 may include a plurality of communications logic units 1808. For instance, a first communications logic unit 1808 may be dedicated to shorter range wireless communications such as Wi-Fi and Bluetooth and a second communications logic unit 1808 may be dedicated to longer range wireless communications such as GPS, EDGE, GPRS, CDMA, WiMAX, LTE, Ev-DO, and others.

The processor 1804 of the computing device 1800 can communicate with one or more devices that are formed in accordance with various embodiments. The term "processor" may refer to any device or portion of a device that processes electronic data from registers and/or memory to transform that electronic data into other electronic data that may be stored in registers and/or memory. The communications logic unit 1808 may also include one or more devices, such as transistors or metal interconnects, that are in communication with various ones of the embodiments disclosed herein.

In various embodiments, the computing device 1800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data.

The above description of illustrated implementations, including what is described in the Abstract, is not intended to be exhaustive or to limit the scope of the disclosure to the precise forms disclosed. While specific implementations of, and examples for, the embodiments disclosed herein are described herein for illustrative purposes, various equivalent modifications are possible within the scope of the disclosure, as those skilled in the relevant art will recognize.

Other Notes and Examples

Example 1 is an apparatus including a nanowire channel, wherein the nanowire channel includes nanowires and the nanowires are about fifteen (15) or less angstroms apart.

In Example 2, the subject matter of Example 1 can optionally include where wherein the nanowires are created from a MXene material.

In Example 3, the subject matter of any one of Examples 1-2 can optionally include where the nanowires are semiconducting with bandgaps in the range of about 0.5 electron volts (eV) to about four (4) eV.

In Example 4, the subject matter of any one of Examples 1-3 can optionally include where the nanowire channel is on a refractory ceramic substrate.

In Example 5, the subject matter of any one of Examples 1-4 can optionally include where the substrate has a melting point in excess of 1000° C.

In Example 6, the subject matter of any one of Examples 1-5 can optionally include where the nanowire channel includes more than ten (10) nanowires.

In Example 7, the subject matter of any one of Examples 1-6 can optionally include where the nanowire channel includes more than one hundred (100) nanowires.

In Example 8, the subject matter of any one of Examples 1-7 can optionally include where the apparatus is a MOS transistor.

In Example 9, a method can include creating a nanowire channel, wherein the nanowire channel includes nanowires and the nanowires are about fifteen (15) or less angstroms apart.

In Example 10, the subject matter of Example 9 can optionally include where the nanowire channel was created by depositing a multilayer structure material on a substrate, creating or enhancing a self-ordered nature of the multilayer structure material, etching the multilayer structure material, creating a dummy gate insulator and a dummy gate electrode on a portion of the etched multilayer structure material, performing source/drain processing, creating isolation of the source/drain regions, removing the dummy gate insulator and the dummy gate electrode, removing a layer of the exposed portion of the multilayer structure material to create channels, and creating a gate insulator and gate electrode on the exposed channels.

In Example 11, the subject matter of any one of Examples 9-10 can optionally include where the nanowire channel includes about thirty (30) to about sixty (60) nanowires.

In Example 12, the subject matter of any one of Examples 9-11 can optionally include where the nanowires are created from a MXene material.

In Example 13, the subject matter of any one of Examples 9-12 can optionally include where the substrate has an amorphous surface structure.

In Example 14, the subject matter of any one of Examples 9-13 can optionally include where the substrate has a melting point in excess of 1000° C.

In Example 15, the subject matter of any one of Examples 9-14 can optionally include where the nanowire channel includes more than ten (10) nanowires.

Example 16 is a computing device including a processor mounted on a substrate, a communications logic unit within the processor, a memory within the processor, a graphics processing unit within the computing device, an antenna within the computing device, a display on the computing device, a battery within the computing device, a power amplifier within the processor, and a voltage regulator within the processor. The processor includes an oxide semiconductor, where the oxide semiconductor includes a nanowire channel, wherein the nanowire channel includes nanowires and the nanowires are about fifteen (15) or less angstroms apart.

In Example 17, the subject matter of Example 16 can optionally include where the nanowire channel includes about thirty (30) to about sixty (60) nanowires.

In Example 18, the subject matter of any one of the Examples 16-17 can optionally include where the nanowires are created from a MXene material.

In Example 19, the subject matter of any one of the Examples 16-18 can optionally include where the nanowire channel includes more than ten (10) nanowires.

In Example 20, the subject matter of any one of the Examples 16-19 can optionally include where the substrate has an amorphous surface structure.

Example 21 is an electronic device including a MOS transistor, wherein the MOS transistor includes a nanowire channel, wherein the nanowire channel includes nanowires and the nanowires are about fifteen (15) or less angstroms apart.

In Example 22, the subject matter of Example 21 can optionally include where the nanowires are semiconducting with bandgaps in the range of about 0.5 electron volts (eV) to about four (4) eV.

In Example 23, the subject matter of any one of the Examples 21-22 can optionally include where the nanowires are created from a MXene material.

In Example 24, the subject matter of any one of the Examples 21-22 can optionally include where the nanowire channel includes more than ten (10) nanowires.

In Example 25, the subject matter of any one of the Examples 21-24 can optionally include where the substrate has an amorphous surface structure.

The invention claimed is:

1. A transistor arrangement, comprising:
   first and second stacks of a plurality of nanowires over a substrate, wherein, for each of the first and second stacks, the plurality of nanowires includes between ten and hundred nanowires, individual nanowires include a MXene material, and the individual nanowires are vertically separated by a distance greater than zero and less than fifteen angstroms;

a first source electrode, enclosing a portion of the first stack over a first portion of the substrate;

a first drain electrode, enclosing a portion of the first stack over a second portion of the substrate;

a second source electrode, enclosing a portion of the second stack over a third portion of the substrate;

a second drain electrode, enclosing a portion of the second stack over a fourth portion of the substrate; and a gate electrode, having a first portion enclosing a portion of the first stack that is between the first source electrode and the first drain electrode, and having a second portion enclosing a portion of the second stack that is between the second source electrode and the second drain electrode, wherein the first portion of the gate electrode is electrically continuous with the second portion of the gate electrode.

2. The transistor arrangement of claim 1, wherein the plurality of nanowires include semiconductor materials with bandgaps in the range of 0.5 electron volts (eV) to four (4) eV.

3. The transistor arrangement of claim 1, wherein the substrate is a refractory ceramic substrate.

4. The transistor arrangement of claim 3, wherein a nanowire of the plurality of nanowires of the first stack is in contact with the refractory ceramic substrate.

5. The transistor arrangement of claim 3, wherein a nanowire of the plurality of nanowires of the first stack is vertically separated from the refractory ceramic substrate by a distance less than fifteen angstroms.

6. The transistor arrangement of claim 1, wherein a surface of the substrate that is closest to the first and second stacks has an amorphous surface structure.

7. The transistor arrangement of claim 6, wherein a nanowire of the plurality of nanowires of the first stack is in contact with the surface.

8. The transistor arrangement of claim 6, wherein a nanowire of the plurality of nanowires of the first stack is vertically separated from the surface by a distance less than fifteen angstroms.

9. The transistor arrangement of claim 1, wherein the transistor arrangement is a MOS transistor arrangement.

10. A method, comprising:

providing first and second stacks of a plurality of nanowires over a substrate, wherein, for each of the first and second stacks, the plurality of nanowires includes between ten and hundred, individual nanowires include a MXene material, and the individual nanowires are vertically separated by a distance greater than zero and less than fifteen angstroms;

providing a first source electrode, enclosing a portion of the first stack over a first portion of the substrate;

providing a first drain electrode, enclosing a portion of the first stack over a second portion of the substrate;

providing a second source electrode, enclosing a portion of the second stack over a third portion of the substrate;

providing a second drain electrode, enclosing a portion of the second stack over a fourth portion of the substrate; and providing a gate electrode, having a first portion enclosing a portion of the first stack that is between the first source electrode and the first drain electrode, and having a second portion enclosing a portion of the second stack that is between the second source electrode and the second drain electrode, wherein the first portion of the gate electrode is electrically continuous with the second portion of the gate electrode.

11. The method of claim 10, wherein providing the first and second stacks includes:

depositing a multilayer structure material on the substrate;

creating or enhancing a self-ordered nature of the multilayer structure material; and etching the multilayer structure material.

12. The method of claim 10, wherein the substrate has an amorphous surface structure.

13. The method of claim 12, wherein the substrate is a refractory ceramic substrate.

14. The method of claim 13, wherein a nanowire of the plurality of nanowires of the first stack is in contact with the refractory ceramic substrate.

15. The method of claim 13, wherein a nanowire of the plurality of nanowires of the first stack is vertically separated from the refractory ceramic substrate by a distance greater than zero and less than fifteen angstroms.

16. The method of claim 12, wherein a nanowire of the plurality of nanowires of the first stack is in contact with the amorphous surface structure.

17. The method of claim 12, wherein a nanowire of the plurality of nanowires of the first stack is vertically separated from the amorphous surface structure by a distance greater than zero and less than fifteen angstroms.

18. A computing device, comprising:

a processor; and a memory coupled to the processor;

wherein the processor includes a transistor arrangement, the transistor arrangement comprising:

first and second stacks of a plurality of nanowires over a substrate, wherein, for each of the first and second stacks, the plurality of nanowires includes between ten and hundred, individual nanowires include a MXene material, and the individual nanowires are vertically separated by a distance greater than zero and less than fifteen angstroms, a first source electrode, enclosing a portion of the first stack over a first portion of the substrate, a first drain electrode, enclosing a portion of the first stack over a second portion of the substrate, a second source electrode, enclosing a portion of the second stack over a third portion of the substrate, a second drain electrode, enclosing a portion of the second stack over a fourth portion of the substrate, and a gate electrode, having a first portion enclosing a portion of the first stack that is between the first source electrode and the first drain electrode, and having a second portion enclosing a portion of the second stack that is between the second source electrode and the second drain electrode, wherein the first portion of the gate electrode is electrically continuous with the second portion of the gate electrode.

19. The computing device of claim 18, wherein the substrate has an amorphous surface structure.

20. The computing device of claim 19, wherein a nanowire of the plurality of nanowires of the first stack is in contact with the amorphous surface structure.

21. The computing device of claim 19, wherein a nanowire of the plurality of nanowires of the first stack is vertically separated from the amorphous surface structure by a distance greater than zero and less than fifteen angstroms.

22. The computing device of claim 18, wherein the substrate is a refractory ceramic substrate, and wherein a nanowire of the plurality of nanowires of the first stack is in contact with the refractory ceramic substrate.

23. The computing device of claim 18, wherein the substrate is a refractory ceramic substrate, and wherein a nanowire of the plurality of nanowires of the first stack is vertically separated from the refractory ceramic substrate by a distance greater than zero and less than fifteen angstroms.

\* \* \* \* \*